United States Patent
Rana et al.

(10) Patent No.: US 10,727,016 B2
(45) Date of Patent: Jul. 28, 2020

(54) ELECTROMECHANICAL RELAY DEVICE

(71) Applicant: The University of Bristol, Bristol (GB)

(72) Inventors: Sunil Rana, Bristol (GB); Dinesh Pamunuwa, Bristol (GB); Liam Anand Boodhoo, Bristol (GB); Harold Meng Hoon Chong, Bristol (GB)

(73) Assignee: The University of Bristol, Bristol (GB)

( * ) Notice: Subject to any disclaimer, the term of this patent is extended or adjusted under 35 U.S.C. 154(b) by 0 days.

(21) Appl. No.: 16/083,583

(22) PCT Filed: Mar. 10, 2017

(86) PCT No.: PCT/GB2017/050655
§ 371 (c)(1),
(2) Date: Sep. 10, 2018

(87) PCT Pub. No.: WO2017/153773
PCT Pub. Date: Sep. 14, 2017

(65) Prior Publication Data
US 2019/0074152 A1  Mar. 7, 2019

(30) Foreign Application Priority Data

Mar. 11, 2016 (GB) .................................. 1604254.1

(51) Int. Cl.
*H01H 59/00* (2006.01)
*B81B 3/00* (2006.01)
*H01H 1/00* (2006.01)

(52) U.S. Cl.
CPC ....... *H01H 59/0009* (2013.01); *B81B 3/0005* (2013.01); *B81B 2201/018* (2013.01);
(Continued)

(58) Field of Classification Search
CPC .............. B81B 3/00–0005; H01H 59/00–0009
See application file for complete search history.

(56) References Cited

U.S. PATENT DOCUMENTS

| 8,519,809 | B1 | 8/2013 | Fu | |
|---|---|---|---|---|
| 2012/0268985 | A1* | 10/2012 | Chang | ................. H03H 9/2457 365/164 |

FOREIGN PATENT DOCUMENTS

| CN | 103177904 | 6/2013 |
|---|---|---|
| EP | 1430498 | 6/2004 |

(Continued)

OTHER PUBLICATIONS

Auciello et al. Status review of the science and technology of ultrananocrystalline diamond (UNCDTM) films and application to multifunctional devices, Elsevier, Diamond & Related Materials, 19 (2010) 699-718 (Year: 2010).*

(Continued)

*Primary Examiner* — Sonya D. McCall-Shepard
(74) *Attorney, Agent, or Firm* — Hunton Andrews Kurth LLP

(57) ABSTRACT

A electromechanical relay device (100) comprising a source electrode (102), a beam (104) mounted on the source electrode at a first end and electrically coupled to the source electrode; a first drain electrode (112) located adjacent a second end of the beam, wherein a first contact (110) on the beam is arranged to be separated from a second contact (112) on the first drain electrode when the relay device is in a first condition; a first gate electrode (106 arranged to cause the beam to deflect, to electrically couple the first contact and the second contact such that the device is in a second condition; and wherein the first and second contacts are each coated with a layer of nanocrystalline graphite.

17 Claims, 3 Drawing Sheets

(52) U.S. Cl.
CPC . *B81B 2203/019* (2013.01); *B81B 2203/0118* (2013.01); *H01H 2001/0052* (2013.01); *H01H 2001/0057* (2013.01); *H01H 2001/0078* (2013.01); *H01H 2201/026* (2013.01); *H01H 2209/002* (2013.01); *H01H 2209/016* (2013.01); *H01H 2227/002* (2013.01)

(56) References Cited

FOREIGN PATENT DOCUMENTS

| EP | 2743955 | | 6/2014 |
|----|---------|---|--------|
| JP | 2017075389 A | * | 4/2017 |
| WO | 2005/117051 | | 12/2005 |

OTHER PUBLICATIONS

International Searching Authority, PCT International Search Report and Written Opinion, International Application No. PCT/GB2017/050655, dated Jun. 13, 2017, pp. 1-14.

Intellectual Property Office, Examination Report Under Section 18(3), Great Britain Application No. 1604254.1, dated Jan. 30, 2017, pp. 1-2.

Intellectual Property Office, Combined Search and Examination Report Under Sections 17 and 18(3), Great Britain Application No. 1604254.1, dated Sep. 12, 2016, pp. 1-7.

* cited by examiner

ELECTROMECHANICAL RELAY DEVICE

This application is a U.S. national phase application under 35 U.S.C. § 371 of International Application No. PCT/GB2017/050655, filed Mar. 10, 2017, which claims priority to U.K. Application No. 1604254.1 filed Mar. 11, 2016 (now U.K. Pat. No. GB2548164), the complete disclosures of which are incorporated herein by reference.

BACKGROUND

Transistors are widely used in integrated circuits. However, transistors only have a limited range of operating conditions. High or low temperatures or ionising radiation can all change the way their constituent semiconductor materials will behave and seriously affect device operation. For example, a commercially available field programmable gate array (FPGA) designed for extreme environments can generally withstand up to 125° C. and 300 krad absorbed dose of radiation.

It is desirable, in some industries, to move electronic sensors closer to high temperature environments, for example to improve control system reaction time and reduce weight of cabling.

Nanoelectromechanical relays are electrically actuated mechanical switches in which a cantilevered or doubly-clamped beam attached to a source electrode is deflected towards a drain electrode using an electric field created from the application of a voltage difference between a gate electrode and the beam. A nanoelectromechanical device can withstand greater than 100 Mrad of radiation dose without additional radiation-hardened packaging and can operate at over 200° C. However, known nanoelectromechanical relay devices are not practical for use in most applications as they can only undergo a very limited number of switching cycles before failure.

SUMMARY

According to a first aspect of the invention, there is provided an electromechanical relay device comprising a source electrode, a beam, which can be mounted on the source electrode at a first end and is electrically coupled to the source electrode; a first drain electrode located adjacent a second portion of the beam, wherein a first contact on the second portion of the beam is arranged to be separated from a second contact on the first drain electrode when the relay device is in a first condition; a first gate electrode arranged to cause the beam to deflect, to electrically couple the first contact and the second contact such that the device is in a second condition; and wherein the first and second contacts are each coated with a layer of nanocrystalline graphite (NCG).

The beam can be attached to the source at the first end in a cantilevered fashion, and the first contact can be located at a second end of the beam, opposite to the first end. Alternatively, the beam can be additionally fixed at a second end, opposite to the first end and the first contact can be located on the beam between the first and second ends. The skilled person will appreciate that other arrangements of the source, beam and drain electrodes can be used.

The gate electrode may be located alongside the beam such that it imparts an electrostatic force directly on the beam, causing the beam to deflect. Alternatively the gate electrode may impart an electrostatic force that indirectly causes the beam to deflect.

A key reason for the failure of known electromechanical devices after a small number of switching cycles is due to the contact materials of the beam and drain electrodes, which degrade after each cycle, causing electrical resistance between the beam and the drain to increase, or the contacts to stick in place due to micro-welding, both of which can make the switch unusable.

Stiction is also a major failure mode in known electromechanical relays, which primarily occurs due to the Van der Waals forces present between the contact area of the beam and the contact area of the drain. In known electromechanical relays, these contact areas are often minimised in order to reduce the stiction. However, minimising the contact area between the beam and the drain increases the electrical resistance between these components which is also undesirable.

The inventors have found that coating the first and second contacts of electromechanical relays with NCG enables hot switching of the electromechanical relays with a significant reduction in instances of failure of the relays due to stiction or micro-welding between the beam and the drain, whilst still maintaining a low contact resistance. Thus, the electromechanical relay device according to the first aspect of the invention can perform many operational cycles without failure, thus showing reliability sufficient for practical use.

The electromechanical relay may be a micromechanical relay, wherein at least one dimension of the relay is between 1 and 1000 μm.

The electromechanical relay may be a nanoelectromechanical relay, wherein at least one dimension of the relay is between 1 and 1000 nm.

In some embodiments, the electromechanical relay may have a footprint area of 1 μm² to 20 μm².

The use of NCG is particularly advantageous for nano and micro electromechanical relays, as for electromechanical relays of these sizes, stiction and microwelding are particularly significant failure modes.

In some embodiments a greater area of the surface of the electromechanical relay may be coated with NCG. In some embodiments the whole surface area of the electromechanical relay may be completely coated with NCG.

The inventors have found that coating the electromechanical relay with NCG also improves the stability of the contacting electrodes of the electromechanical relay, enabling the relay to be stored in ambient conditions at room temperature without the need for hermetic packaging.

The NCG layer can be at least 10 nm in thickness. The NCG layer can be between 10 nm and 80 nm in thickness on each surface.

The electromechanical relay can be fabricated with a conductive thin-film on the surface of the device, including the contact area, underneath the NCG layer. The NCG layer can then be deposited on top of the conductive layer.

Including a conductive layer underneath the NCG layer can reduce the resistance between the beam and the drain when they are in contact.

The conductive layer can be formed in a variety of ways, including but not limited to, deposition of a conductive film comprising metal, deposition of a conducting film comprising an oxide, or formation of a metal silicide.

The electromechanical relay device can further comprise a second gate and a second drain electrode, wherein the first gate is located along one side of the beam and the second gate is located along an opposing side of the beam; and wherein the beam has a forked section comprising a first and a second branch; and one or more auxiliary gates are located between the first and second branches, such that the beam is arranged to be separated from the first and second drain electrodes when the device is in a first state; the first gate and an auxiliary gate being arranged to impart an electrostatic force on the beam to deflect the beam to electrically couple the first branch and the first drain electrode when the device is in the second state; and the second gate and an auxiliary gate being arranged to impart an electrostatic force on the beam to deflect the beam to electrically couple the second branch and the second drain electrode when the device is in the third state.

This geometry is advantageous as it enables bi-directional operation of the relay, whilst only requiring a single lithography step for the relay definition. Furthermore, including an auxiliary gate is advantageous as this increases the electrostatic actuation force, enabling a lower voltage to be used to deflect the beam.

The beam may comprise a hinge located between the forked section and the first end.

The hinge can be, for example a section of the beam having a narrower width than the main body of the beam, such that the stiffness of the beam is reduced at the hinge. Alternatively the hinge can be formed by reducing the stiffness of the beam between the forked section and the first end using other methods, for example by using a serpentine geometry.

Including a hinge in the beam is advantageous as the hinge acts as a stress concentration region, which minimises stress and deformation across the rest of the beam. Thus the beam is less likely to collapse onto the gate, which can be a common problem for electromechanical relays with known geometries.

Preferably, the fork angle (the angle between the unbranched and branched sections of the beam) may be between 30° and 45°.

According to a second aspect of the invention, there is provided a method for producing an electromechanical relay comprising patterning the silicon device layer using lithography, releasing the relay beam by etching an underlying silicon dioxide sacrificial layer and critical point drying, and blanket depositing a layer of NCG onto the device silicon by plasma-enhanced chemical vapour deposition.

A conductive layer may be deposited onto the device silicon prior to deposition of the NCG.

According to a third aspect of the invention there is provided an electromechanical relay device comprising a source electrode, a beam mounted on the source electrode at a first end that is electrically coupled to the source electrode, first and second gates and first and second drain electrodes; wherein the first gate is located along one side of the beam and the second gate is located along an opposing side of the beam; and wherein the beam has a forked section comprising a first and a second branch; and one or more auxiliary gates are located between the first and second branches, such that the beam is arranged to be separated from the first and second drain electrodes when the device is in a first state; the first gate and an auxiliary gate being arranged to impart an electrostatic force on the beam to deflect the beam to electrically couple the first branch and the first drain electrode when the device is in the second state; and the second gate and an auxiliary gate being arranged to impart an electrostatic force on the beam to deflect the beam to electrically couple the second branch and the second drain electrode when the device is in the third state.

It will be appreciated that features of the first aspect can also apply analogously to the third aspect.

BRIEF DESCRIPTION OF THE DRAWINGS

Embodiments of the invention will now be described with reference to the accompanying drawings, in which.

DETAILED DESCRIPTION

Figure 1:
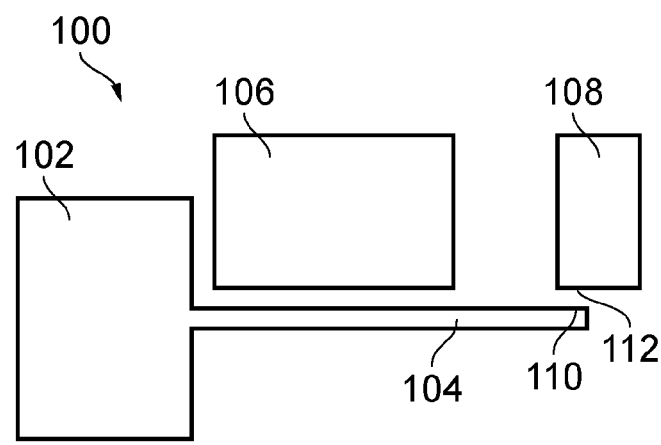
FIG. 1 is a schematic diagram of an electromechanical relay device according to a first embodiment in a first state.

In FIG. 1, an electromechanical relay device according to a first embodiment is shown generally at 100. The electromechanical relay device has a source electrode (source) 102, which is an input terminal, connected to a voltage source (not shown). A cantilever beam 104 is attached at one end to the source and has a free end at an opposite end of the beam 104. The beam 104 may be a separate element which is attached to the source 102 by any suitable means. Preferably, the beam can be integrally formed as part of the source 102. The electromechanical relay 100 further includes a gate 106 which is an actuation terminal, located alongside the beam 104, on a first side of the beam and is connected to a voltage source. The electromechanical relay device further includes a drain electrode (drain) 108, which is an output terminal, located on the first side of the beam, in line with the free end of the beam. The electromechanical relay device is made of silicon. FIG. 1 shows the electromechanical relay device in a first state in which the beam 104 and the drain 108 are separated by an air gap. In the embodiment shown in FIG. 1, the first state is an "off" state. In the embodiment shown in FIG. 1, the source 102, beam 104, drain 108 and gate 106 are formed from silicon.

Figure 2:
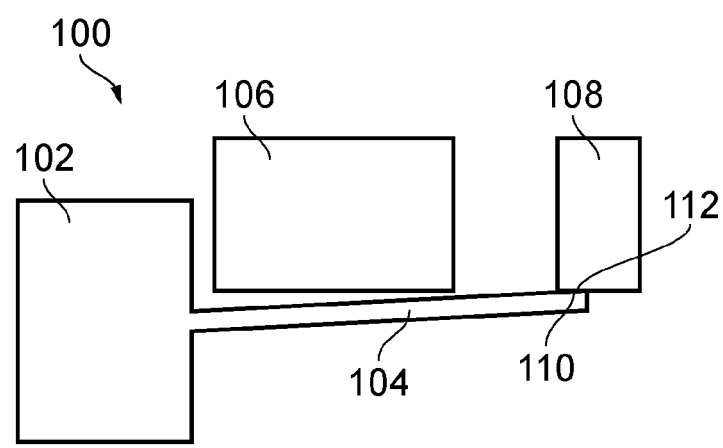
FIG. 2 is a schematic diagram of the electromechanical relay device of FIG. 1, in a second state.

FIG. 2 shows an electromechanical relay device in a second state, in which the beam 104 contacts the drain 108. In the embodiment shown in FIG. 2, the second state is an "on" state. In order to cause the electromechanical relay device to transition from the first state to the second state, a voltage differential is applied between the beam 104 and the gate 106, causing the beam 104 to bend towards the gate 106, until eventually, a first contact 110 located on the free end of the beam 104 makes contact with a second contact 112 located on the drain 108. The voltage at which the beam 104 is bent sufficiently to come into contact with the drain 108 is known as the "pull in" voltage. If the voltage applied between the beam 104 and the gate 106 is subsequently lowered, the beam 104 will separate from the drain 108 and the electromechanical relay 100 will return to the first state. The voltage at which the beam 104 separates from the drain 108 is known as the "pull out" voltage, which is a lower voltage than the pull in voltage.

The electromechanical relay 100 is coated with a 50 nm layer of NCG. However, in some embodiments, the layer of NCG may be between 10 nm and 80 nm. In some embodiments, the electromechanical relay may not be completely coated with NCG, although the first contact 110 and the second contact 112 at least are each coated with NCG.

It will be appreciated that other arrangements of the source, drain and gate electrodes can be used in embodiments of the invention. For example, in some embodiments, the beam may be doubly-clamped and the first contact area may be located between ends of the beam.

In some embodiments, the electromechanical relay can comprise a second gate located alongside the beam on a second side of the beam, and a second drain, located on the second side of the beam in line with the free end of the beam. In these embodiments, the electromechanical relay device is bi-directional as the beam can be pulled in a first direction by the first gate to contact the first drain or can be pulled in a second direction by the second gate to contact the second drain.

Figure 3:
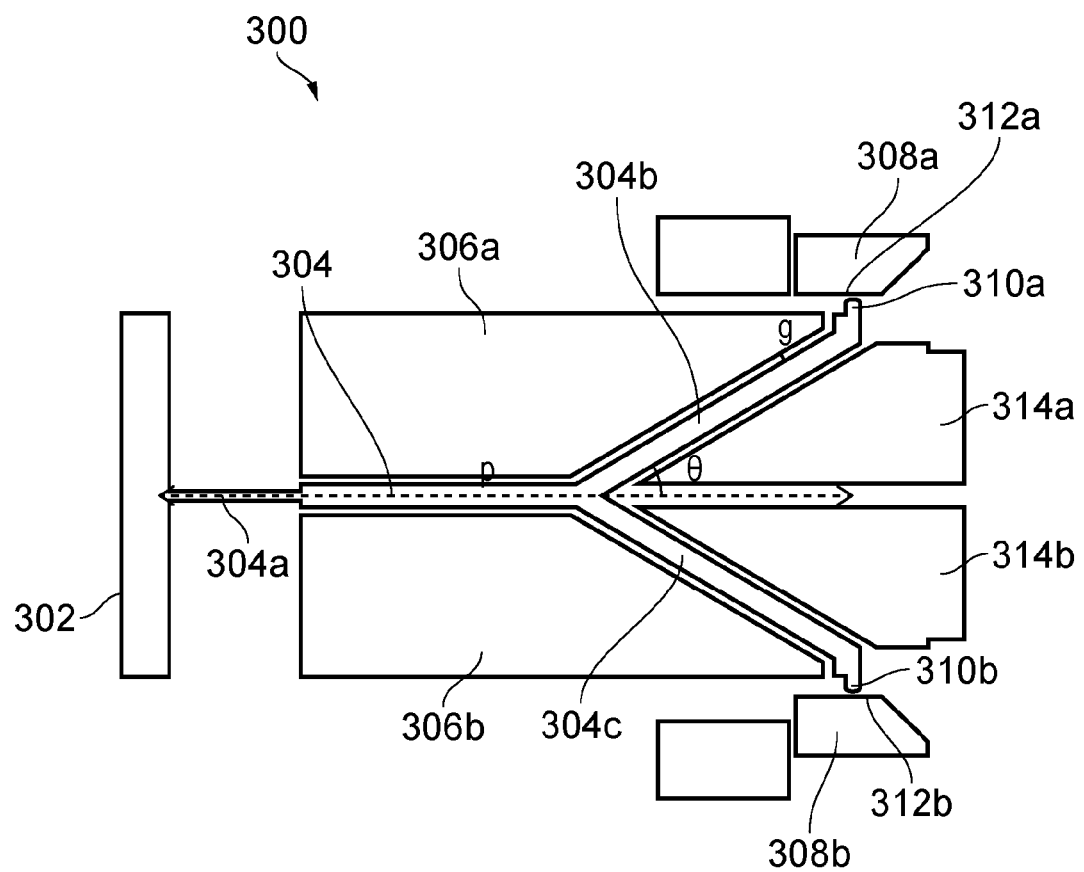
FIG. 3 is a schematic diagram of an electromechanical relay device according to a second embodiment.

In FIG. 3, an electromechanical relay device according to a second embodiment is shown generally at 300. The electromechanical relay device comprises a source 302, with a beam 304 attached to the source at a first end. The beam 304 and source 302 are integrally formed as a single unit.

At the first end, the width of the beam 304 is narrower than the main body of the beam 304, forming a hinge 304a. At a second end, opposite to the first end, the beam 304 has a forked section, in which the beam 304 is split into two branches, 304b and 304c. In the embodiment shown in FIG. 3, the fork angle θ is 30°. However, in some embodiments another fork angle can be used. Preferably the fork angle is between 30° and 45°.

The electromechanical relay 300 comprises a first gate 306a which is located along a first side of the beam 304, extending alongside an outer edge of the first branch 304b; and a second gate 306b, which is located along a second side of the beam 304, extending alongside an outer edge of the second branch 304c.

The electromechanical relay 300 further includes a first drain 308a, located adjacent to a contact 310a at a free end of the first branch 304b, and a second drain 308b, located adjacent to a contact 310b at a free end of the second branch 304c.

The electromechanical relay 300 also includes a first auxiliary gate 314a, located alongside an inner edge of the first branch 304b, and a second auxiliary gate 314b, located alongside an inner edge of the second branch 304c.

In the embodiment shown in FIG. 3, the source 302, beam 304, drains 308a, 308b and gates 306a, 306b, 314a, 314b are formed from silicon.

The electromechanical relay 300 operates in a similar manner as described with respect to FIG. 1. However, electromechanical relay 300 is operable to transition between three different states. In the first state, both of the first and second branches 304b, 304c are separated from the first and second drains 308a, 308b. To transition the electromechanical relay to a second state, a differential voltage is applied between the branch 304 and the gates 306a and 314b in a first direction, such that the beam 304 is pulled towards the first gate 306a and the first contact 310a on the free end of the first branch 304b makes contact with a second contact 312a on the first drain 308a. To transition the electromechanical relay 300 to a third state, a differential voltage is applied between the branch 304 and the gates 306b and 314a in a second direction, such that the beam 304 is pulled towards the second gate 306b and a third contact 310b on the free end of the second branch 304c makes contact with a fourth contact 312b on the free end of the second drain 308b.

The electromechanical relay 300 is coated with a 50 nm layer of NCG. However, in some embodiments, the layer of NCG can be between 10 nm and 80 nm. In some embodiments, the electromechanical relay may not be completely coated with NCG, although the first, second, third and fourth contacts are each coated with a layer of NCG.

In the embodiment shown in FIG. 3, the horizontal projection, p, of the beam length is between 90 and 200 μm. The gate-to-beam actuation gap, g, is between 1 and 2 μm. However, it will be appreciated that all of the embodiments of the invention can be scaled, and some embodiments can have different dimensions. In some embodiments, the electromechanical relay device can have a footprint of 1 μm² to 20 μm². In some embodiments the electromechanical relay device can have an overall footprint of 3 μm×2 μm, or of 6 μm².

The use of an NCG coating on the contacts of the device is particularly advantageous for nano and micro electromechanical relays, as for electromechanical relays of these sizes, stiction and microwelding are particularly significant failure modes.

Figure 4:
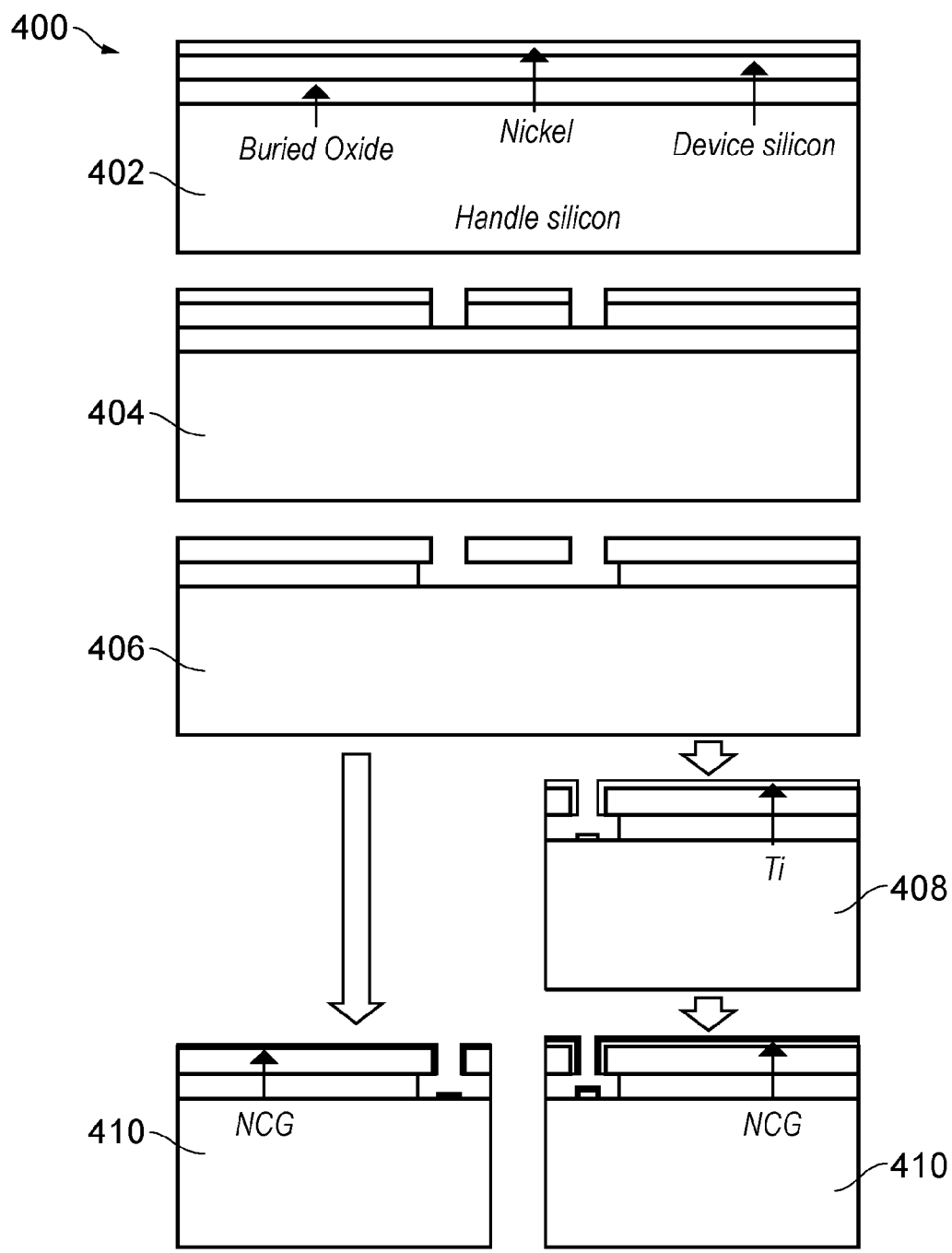
FIG. 4 is a schematic diagram of a method of producing the electromechanical relay device of FIG. 3.

In FIG. 4, a method of producing the electromechanical relay device of FIG. 3 is shown generally at 400. The electromechanical relay device of FIG. 3 has been fabricated from silicon-on-insulator (SOI) wafers. At step 402, a 60 nm thick layer of nickel N, to be used as a hard mask, is deposited on the device silicon ds layer using evaporation. A layer of buried oxide BO separates the device silicon DS from an underlying layer of handle silicon HS. At step 404, the nickel layer is patterned using optical lithography (for example, using S1805 positive photoresist) and a timed nickel wet etch. At step 406, the device silicon layer is etched using $SF_6/O_2$ inductively coupled plasma (ICP). Once the relay pattern is transferred to the device silicon layer, the nickel hard mask is stripped off using a wet etch at step 406, and the wafer is diced and the relay beam is released using a buffered HF etch of BO followed by critical point drying. Optionally, at step 408, a 20 nm thick layer of metal such as titanium Ti is sputtered on to the device silicon. Finally, at step 410, a 50 nm thick layer of NCG is blanket deposited on device by plasma-enhanced chemical vapour deposition (PEVCD), for example, using an Oxford Instruments Nanofab 1000 Agile PECVD tool.

It will however be appreciated that an electromechanical relay according to embodiments of the invention can be produced in other ways; for example, different masking materials may be used, such as photoresist only, or silicon dioxide as a hard mask; different lithography methods such as electron-beam (e-beam) lithography may be used with compatible masking materials (e-beam photoresists); different conductive films, including, but not limited to, metals such as Pt, Au, W, conductive oxides such as ITO and silicides may be used; the air gap between the beam and gate electrode, which is defined lithographically in the above process, may be defined using a silicon dioxide sacrificial layer instead.

Embodiments of the application can be used advantageously in a number of applications. For example, in the aerospace industry, aircraft electronics experience 500 times the cosmic radiation at ground level, which is a level of radiation that is easily withstood by electromechanical relays with no additional radiation hardening required. There is also a requirement for electronic components for fuel control systems, which need to operate at around 200° C.

In automotive applications, there is a requirement to increase fuel efficiency and reduce emissions ($CO_2$ and NOx). Placing electronics and sensors closer to high temperature areas can address this by improving control systems response and reducing weight. For engines that include a turbocharger, exhaust temperatures can exceed 1000° c., so there is a requirement for electronic components located near to these systems to withstand high temperatures.

Another example of an application in which the invention can be used advantageously is in sensors for domestic boilers, for example carbon monoxide and carbon dioxide sensors, which are required to withstand temperatures up to 225° c.

Oil and gas drills require sensors at the tip of the drill to monitor $CO_2$, $H_2S$, water and temperature. Communication with the drill is of very limited bandwidth, requiring much processing to be done at the tip of the drill. Therefore a number of electronic components are located at the tip of the drill. The environment at the drill tip can have a temperature of 170° C.

Electronic components in nuclear reactors need to withstand very high levels of radiation and high temperatures, and electromechanical relays are able to operate under absorbed levels of gamma radiation and heavy ion fluences that are two orders of magnitude higher than conventional transistors, at a temperature of over 200° C. Thus they have potential in civilian power-generation applications as well as defence applications such as electronic components in nuclear submarines, drones in nuclear disaster areas and missile heads.

New computing paradigms such as the internet of things demand extreme energy efficiency in microprocessors, for example to form autonomous remote sensing nodes that are powered by energy scavenging from natural phenomena. Electromechanical relays have zero leakage current and thus eliminate one of the main challenges in realising such systems.

In the applications mentioned above, the electromechanical relay device of the invention can provide advantages due to its ability to withstand high temperature and ionising radiation, and due to its having zero quiescent current in the off-state. It will be appreciated that the electromechanical relay device can be used advantageously in other applications, in particular in applications where high temperatures, and/or high levels of radiation are present, and/or where extreme energy efficiency is a requirement.

Although the invention has been described above with reference to one or more preferred embodiments, it will be appreciated that various changes or modifications may be made without departing from the scope of the invention as defined in the appended claims. The word "comprising" can mean "including" or "consisting of" and therefore does not exclude the presence of elements or steps other than those listed in any claim or the specification as a whole. The mere fact that certain measures are recited in mutually different dependent claims does not indicate that a combination of these measures cannot be used to advantage.

What is claimed is:

1. An electromechanical relay device comprising:
   a source electrode;
   a beam electrically coupled to the source electrode;
   a first drain electrode located adjacent a first contact on the beam, wherein the first contact is arranged to be separated from a second contact on the first drain electrode when the relay device is in a first condition;
   a first gate electrode arranged to cause the beam to deflect, to electrically couple the first contact and the second contact such that the device is in a second condition;
   a second gate electrode; and
   a second drain electrode,
   wherein the first and second contacts are each coated with a layer of nanocrystalline graphite,
   wherein the first gate electrode is located along one side of the beam and the second gate electrode is located along an opposing side of the beam,
   wherein the beam has a forked section comprising a first and a second branch,
   wherein one or more auxiliary gate electrodes are located between the first and second branches, such that the beam is arranged to be separated from the first and second drain electrodes when the device is in a first state,
   wherein the first gate electrode and an auxiliary gate electrode are arranged to impart an electrostatic force on the beam to deflect the beam to electrically couple the first branch and the first drain electrode when the device is in the second state, and
   wherein the second gate electrode and an auxiliary gate electrode are arranged to impart an electrostatic force on the beam to deflect the beam to electrically couple the second branch and the second drain electrode when the device is in the third state.

2. An electromechanical relay device according to claim 1, wherein a majority of a total surface area of the electromechanical relay device is coated with a layer of nanocrystalline graphite.

3. An electromechanical relay device according to claim 1, further comprising a conductive layer provided underneath the nanocrystalline graphite layer.

4. An electromechanical relay device according to claim 1, wherein the beam and the source electrode are integrally formed as a single unit.

5. An electromechanical relay device according to claim 1, further comprising one or more auxiliary gate electrodes located between the branches of the beam.

6. An electromechanical relay device according to claim 1, wherein the beam comprises a hinge located between the forked section and the source electrode.

7. An electromechanical relay device according to claim 1, wherein the electromechanical relay device is a nanoelectromechanical relay device.

8. A micro or nano electromechanical relay device comprising:
   a source electrode;
   a beam electrically coupled to the source electrode;
   a first drain electrode located adjacent a first contact on the beam, wherein the first contact is arranged to be separated from a second contact on the first drain electrode when the relay device is in a first condition; and
   a first gate electrode arranged to cause the beam to deflect, to electrically couple the first contact and the second contact such that the device is in a second condition,
   wherein the first and second contacts are each coated with a layer of nanocrystalline graphite which is at least 10 nanometers in thickness.

9. A method for producing an electromechanical relay device according to claim 1, the method comprising:
   providing a silicon wafer, having a device silicon layer and an underlying silicon dioxide layer;
   patterning the device silicon layer using lithography to form a beam;
   releasing the beam by etching the underlying silicon dioxide layer and critical point drying; and
   blanket depositing a layer of nanocrystalline graphite onto the device silicon layer by plasma-enhanced chemical vapour deposition.

10. A method according to claim 9, further comprising depositing a conductive layer onto the device silicon prior to deposition of the nanocrystalline graphite.

11. A micro or nano electromechanical relay device according to claim 8, wherein a majority of a total surface area of the electromechanical relay device is coated with a layer of nanocrystalline graphite.

12. A micro or nano electromechanical relay device according to claim 8, further comprising a conductive layer provided underneath the nanocrystalline graphite layer.

13. A micro or nano electromechanical relay device according to claim 8, wherein the beam and the source electrode are integrally formed as a single unit.

14. A micro or nano electromechanical relay device according to claim 8, further comprising a second gate electrode and a second drain electrode, wherein the first gate electrode is located along one side of the beam and the second gate electrode is located along an opposing side of the beam; and wherein the beam has a forked section comprising a first and a second branch; and one or more auxiliary gate electrodes are located between the first and second branches, such that the beam is arranged to be separated from the first and second drain electrodes when the device is in a first state;

the first gate electrode and an auxiliary gate electrode are arranged to impart an electrostatic force on the beam to deflect the beam to electrically couple the first branch and the first drain electrode when the device is in the second state; and the second gate electrode and an auxiliary gate electrode are arranged to impart an electrostatic force on the beam to deflect the beam to electrically couple the second branch and the second drain electrode when the device is in the third state.

15. A micro or nano electromechanical relay device according to claim 14, further comprising one or more auxiliary gate electrodes located between the branches of the beam.

16. A micro or nano electromechanical relay device according to claim 14, wherein the beam comprises a hinge located between the forked section and the source electrode.

17. A micro or nano electromechanical relay device according to claim 8, wherein each layer of nanocrystalline graphite is no more than 80 nanometers in thickness.

* * * * *